(12) United States Patent
Shiraishi

(10) Patent No.: US 7,139,186 B2
(45) Date of Patent: Nov. 21, 2006

(54) FAILURE DETECTION CIRCUIT

(75) Inventor: Hidetoshi Shiraishi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 37 days.

(21) Appl. No.: 11/109,699

(22) Filed: Apr. 20, 2005

(65) Prior Publication Data

US 2005/0237782 A1  Oct. 27, 2005

(30) Foreign Application Priority Data

Apr. 23, 2004  (JP)  .............. 2004-128701

(51) Int. Cl.
G11C 11/22  (2006.01)
(52) U.S. Cl. ...................... 365/145; 365/210
(58) Field of Classification Search ............... 365/145, 365/149, 206, 207, 209, 210, 211, 213
See application file for complete search history.

(56) References Cited

U.S. PATENT DOCUMENTS 4,395,139 A * 7/1983 Namiki et al. .............. 374/178
6,104,075 A * 8/2000 Karaki ....................... 257/467
6,438,020 B1 * 8/2002 Yamada ...................... 365/145
6,704,218 B1 * 3/2004 Rickes et al. ............... 365/145
6,804,141 B1 * 10/2004 Rickes et al. ............... 365/145
6,922,799 B1 * 7/2005 Koike ......................... 714/718
6,999,335 B1 * 2/2006 Murakuki ................... 365/145

FOREIGN PATENT DOCUMENTS

JP  56-135963  10/1981

* cited by examiner

Primary Examiner—Richard Elms
Assistant Examiner—Hien N Nguyen
(74) Attorney, Agent, or Firm—Foley & Lardner LLP

(57) ABSTRACT

A failure detection circuit that can detect the performance degradation of a FeRAM caused by thermal stress regardless of whether power is being supplied or not, and prevent the use of a deteriorated FeRAM. It comprises a detector FeRAM cell structured identically to a memory cell actually employed and used for detecting the performance degradation of the FeRAM, a filtering voltage generator circuit, which generates a filtering voltage used for determining the performance degradation, an expected value output circuit, which outputs an expected value equal to the data already stored in the detector FeRAM cell, a sense amplifier, which reproduces data stored in the detector FeRAM cell using the filtering voltage, and a comparator, which outputs an failure detection signal indicating the performance degradation of the FeRAM when the expected value and the data reproduced by the sense amplifier don't match.

16 Claims, 2 Drawing Sheets

FAILURE DETECTION CIRCUIT

FIELD OF THE INVENTION

The present invention relates to a failure detection circuit for detecting the performance degradation of a FeRAM (ferroelectric random access memory) mounted on a semiconductor integrated circuit device and an electronic device.

BACKGROUND OF THE INVENTION

In recent years, the growing market of portable devices such as mobile phone, PDA, and digital camera, has increased the demand for nonvolatile memory. Especially FeRAM (Ferroelectric Random Access Memory) is receiving much attention because it requires small power consumption and has high-speed data read/write capability.

FeRAM comprises memory cell created by combining capacitor element using ferroelectric material as insulator and cell selecting transistor, or memory cell composed of FET with capacitor element in its gate electrode part using ferroelectric material, and stores data by utilizing the residual polarization of the ferroelectric material.

FeRAM has a number of desirable characteristics: it can operate at low voltage, has a rewrite frequency greater than flash memory and EEPROM (Electrically Erasable Programmable Read-Only Memory) by multiple digits, and is capable of high integration due to the fact that its circuit structure is similar to that of DRAM (Dynamic Random Access Memory).

However, data stored in FeRAM cannot be read accurately when placed in a high temperature environment (sometimes referred to as thermal stress hereinafter) because the capacity of the capacity element decreases due to the physical characteristics of ferroelectric material. In order to solve this, a temperature detecting circuit that detects the ambient temperature of FeRAM and generates an alarm signal when exceeding a prescribed temperature can be used for detecting performance degradation. As a temperature detecting circuit, for instance, a semiconductor integrated circuit that utilizes the voltage-current characteristics of diode for temperature sensing is described in Patent Document 1.

In Patent Document 1, a constant current Iref is flowed in a bipolar transistor Q1, of which the base and collector are connected, using a constant current circuit 100 as shown in FIG. 3, and an abnormal ambient temperature is detected by observing a voltage change VBE between the base and emitter of the transistor Q1.

Paten Document 1
  Japanese Patent Kokai Publication No. JP-A-56-135963

SUMMARY OF THE DISCLOSURE

However, the temperature detecting circuit described in the Patent Document 1 mentioned above has a problem; it does not function as a temperature sensor when power is not being supplied to it since it utilizes the voltage-current characteristics of diode for temperature sensing.

Since the holding performance of FeRAM is degraded by thermal stress even during storage when power is not being supplied to it, stored data might not be read accurately afterwards. Therefore, even if a circuit that functions as a temperature sensor when power is being supplied is provided, in the cases where desired data is stored in a FeRAM and used after being kept for a certain period of time, the reliability of the stored data will not be guaranteed since the performance degradation of the FeRAM caused by thermal stress applied during the state when power is not being supplied cannot be detected.

For instance, in the case where important information such as electronic money is written on an IC card with a built-in FeRAM, even if the balance information is changed to zero due to the fact that it has been stored in a high temperature environment, the user, without any means for being informed of it, will suffer a loss by using the IC card with the altered information. Thus there is much to be desired in the art.

It is an object of the present invention to provide a failure detection circuit that can detect the performance degradation of a FeRAM caused by thermal stress regardless of whether power is being supplied or not, and prevent the use of a deteriorated FeRAM.

According to an aspect of the present invention, there is provided a failure detection circuit for detecting the performance degradation of a FeRAM. The circuit comprises: a detector FeRAM cell structured identically to an original cell actually employed within the FeRAM and used for detecting the performance degradation; a filtering voltage generator circuit, which generates a filtering voltage used for determining the performance degradation; an expected value output circuit, which outputs an expected value equal to the data already stored in the detector FeRAM cell; a sense amplifier, which reproduces data stored in the detector FeRAM cell using the filtering voltage; and a comparator, which compares the expected value and the data reproduced by the sense amplifier, and outputs an failure detection signal indicating the performance degradation of the FeRAM when they don't match. The same structure as that of a either 1T1C-type or 2T2C-type memory cell may be used for the detector FeRAM cell.

Furthermore, according to another aspect of the present invention there is provided a failure detection circuit for detecting the performance degradation of a FeRAM, which comprises: a detector FeRAM cell structured identically to an original cell actually employed within the FeRAM and used for detecting the performance degradation; a filtering current generator circuit, which generates a filtering current used for determining the performance degradation; an expected value output circuit, which outputs an expected value equal to the data already stored in the detector FeRAM cell; a sense amplifier, which reproduces data stored in the detector FeRAM cell using the filtering current; and a comparator, which compares the expected value and the data reproduced by the sense amplifier, and outputs an failure detection signal indicating the performance degradation of the FeRAM when they don't match. The same structure as that of a 1T-type memory cell may be used for the detector FeRAM cell.

The meritorious effects of the present invention are summarized as follows.

Since the failure detection circuit configured as described above comprises the detector FeRAM cell structured identically to the original cell actually employed within the FeRAM, and an failure detection signal indicating the performance degradation of the FeRAM is outputted from the comparator when the expected value and the data within the detector FeRAM cell reproduced by the sense amplifier don't match, the holding state of data stored in the FeRAM can be detected by checking for the failure detection signal. Therefore, the mistaken use of a FeRAM whose performance is deteriorated by thermal stress can be prevented.

PREFERRED EMBODIMENTS OF THE INVENTION

Next, the present invention will be described with reference to drawings.

Embodiment 1

Figure 1:
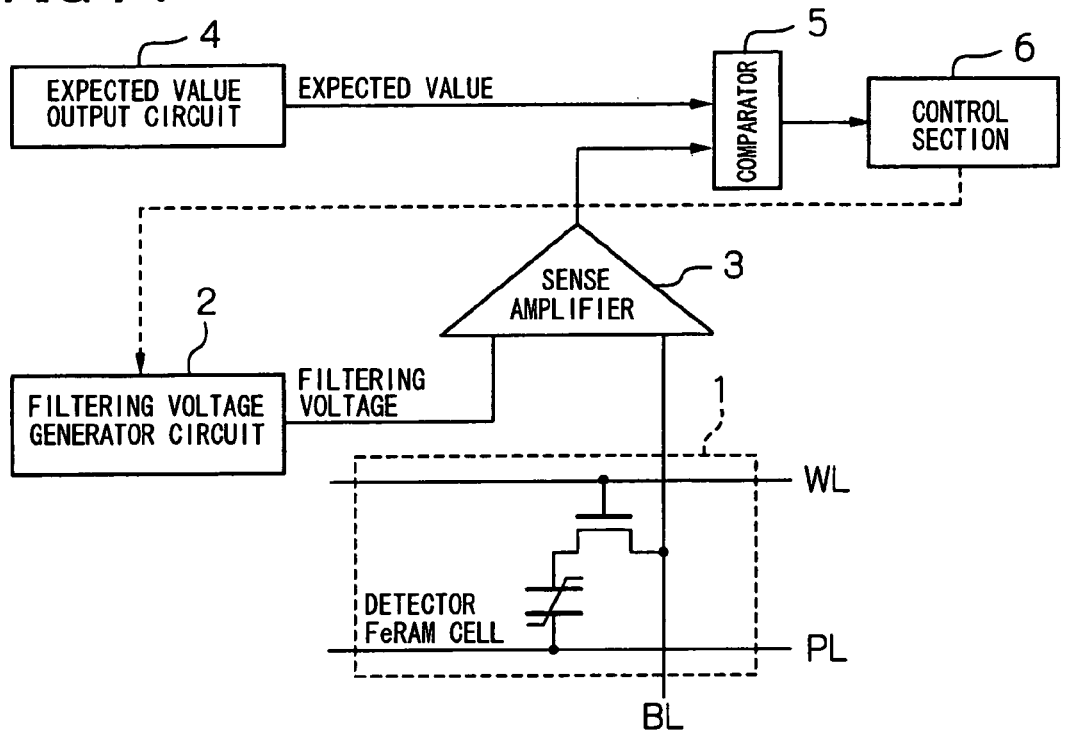
FIG. 1 is a block diagram showing the configuration of the first embodiment of the failure detection circuit according to the present invention.

FIG. 1 is a block diagram showing the configuration of a first embodiment of a failure detection circuit according to the present invention.

As shown in FIG. 1, the failure detection circuit of the first embodiment comprises a detector FeRAM cell 1 used for detecting the performance degradation of memory cells caused by high temperature, a filtering voltage generator circuit 2, which generates a filtering voltage used for determining the performance degradation of a FeRAM, a sense amplifier 3, which reproduces data stored in the detector FeRAM cell 1 using the filtering voltage, an expected value output circuit 4, which outputs an expected value equal to the data already stored in the detector FeRAM cell 1, and a comparator 5, which compares the expected value and the data reproduced by the sense amplifier 3, and outputs an failure detection signal indicating the performance degradation of the FeRAM when they don't match.

The failure detection circuit of the first embodiment is configured so that it detects the performance degradation of a FeRAM comprising multiple memory cells created by combining capacitor elements (ferroelectric capacitor hereinafter) using ferroelectric material and cell selecting transistors. Two forms of such a FeRAM are known: a form called 1T1C type where one ferroelectric capacitor holds data "1" or "0", and the other form called 2T2C type where one ferroelectric capacitor holds data "1" and the other ferroelectric capacitor paired with the first one holds data "0". The failure detection circuit shown in FIG. 1 is configured so that the performance degradation of the FeRAM is determined by having the sense amplifier 3 detect the change of the voltage held by the ferroelectric capacitor of the detector FeRAM cell 1.

The detector FeRAM cell 1 has the same structure as a memory cell (called original cell hereinafter) actually used in the FeRAM, either above described 1T1C or 2T2C type, and is used for detecting the performance degradation instead of this original cell. When the detector FeRAM cell 1 is 2T2C type, the detector FeRAM cell 1 is constituted of two memory cells for holding data "1" and "0" respectively. It is desirable that this detector FeRAM cell 1 be formed simultaneously with the original cell of the FeRAM, the detection object. If this is the case, the performance degradation of the FeRAM caused by thermal stress will be detected accurately since the detector FeRAM cell 1 and the original cell will have the same holding performance.

As shown in FIG. 1, a plate voltage is applied to the ferroelectric capacitor of the detector FeRAM cell 1, as the original cell, through a plate line (PL) connected to its end.

Also, a prescribed voltage is applied to a gate electrode through a word line (WL) so that the cell selecting transistor is turned on when data is being written or read. Further, the output voltage (the holding voltage of the ferroelectric capacitor) from the cell selecting transistor is outputted to the sense amplifier 3 through a bit line (BL).

The expected value output circuit 4 comprises a logic circuit, whose input is the ground electric potential or power supply voltage for instance, and generates and outputs an expected value equal to the data stored in the detector FeRAM cell 1. Further, the expected value output circuit 4 can be configured so that it holds the expected value using a nonvolatile memory, instead of a logic circuit, such as a flash memory or EEPROM, in which stored data cannot be easily destroyed by thermal stress compared to a FeRAM. It can also be constituted of a register, to which a prescribed data is written from a hard disk device, etc. each time power is supplied, or a known constant voltage circuit that generates voltages corresponding to data "1" and "0".

The filtering voltage generator circuit 2 comprises a known constant voltage circuit that outputs a prescribed constant voltage (filtering voltage). Corresponding to an expected value of data "1" or "0", the filtering voltage is set to an optimum value for determining each data.

The sense amplifier 3 is a differential amplifier that amplifies a difference between the filtering voltage and the output voltage of the detector FeRAM cell 1. For instance, when the output voltage of the detector FeRAM cell 1 is higher than the filtering voltage, it outputs a voltage that corresponds to data "1", and when the output voltage of the detector FeRAM cell 1 is lower than the filtering voltage, it outputs a voltage that corresponds to data "0".

The comparator 5 is constituted of a logic gate such as exclusive OR circuit, and when the data reproduced by the sense amplifier 3 does not match with the expected value, it outputs a failure detection signal (logic "1") indicating the performance degradation of the memory cell.

In the failure detection circuit of the present invention with the configuration described above, optional data is stored in the detector FeRAM cell 1 beforehand. When data is stored in the detector FeRAM cell 1, the cell selecting transistor of the detector FeRAM cell 1 is turned on by applying a prescribed voltage through the word line (WL). Further, a prescribed write voltage is applied to the bit line (BL). At this time, the ferroelectric material of the ferroelectric capacitor is polarized in response to the write voltage, and the ferroelectric capacitor maintains a voltage that corresponds to data "1" or "0" even after the write voltage is turned off.

In the present embodiment, a voltage held by the ferroelectric capacitor of the detector FeRAM cell 1 each time power is supplied is detected by the sense amplifier 3, and the data stored in the detector FeRAM cell 1 is reproduced. The filtering voltage used at this reproduction of the data is set to a value so that the data stored in the detector FeRAM cell 1 cannot be read accurately before a failure occurs in the original cell. For example, when the expected value is "1" and a reference voltage for judging the data stored in the original cell as "1" is 1V, the filtering voltage should be set to, for example, 1.2V, which is higher than the reference voltage. In this case, when the output voltage of the detector FeRAM cell 1 becomes lower than 1.2V due to thermal stress, a failure can be detected before the performance degradation of the original cell occurs since the sense amplifier 3 judges it as data "0".

As thermal stress decreases the capacity of ferroelectric capacitor, the holding voltage also decreases. Therefore, in the case where data "0" is stored in the detector FeRAM cell 1, if the filtering voltage is set to a higher value than the reference voltage for judging data in the original cell as "0", a margin against the reference voltage will increase when trying to detect the performance degradation caused by thermal stress. Thus, when data "0" is stored in the detector FeRAM cell 1, a 2T2C-type detector FeRAM cell should be used to confirm change of data stored in the other detector FeRAM cell 1.

Data reproduced by the sense amplifier 3 is compared by the comparator 5 with an expected value, and when the reproduced data and the expected value don't match, a failure detection signal indicating the performance degradation of the FeRAM is outputted. The failure detection signal can be outputted to outside, but it can also be supplied to a control section 6 comprising a DSP, etc. In this case, the memory failure is notified by the control section 6 to outside, and at the same time, the access to the FeRAM from other devices not shown in the drawing should be stopped.

According to the failure detection circuit of the present embodiment, since the holding state of data stored in a FeRAM can be detected by checking for a failure detection signal, the mistaken use of a FeRAM whose performance is deteriorated by thermal stress can be prevented. On the other hand, when no failure detection signal is being outputted, it indicates the performance of the FeRAM is not deteriorated and the stored data is guaranteed.

An example where the performance degradation of a FeRAM caused by thermal stress applied during storage is detected by checking for a failure detection signal each time power is turned on is described above, however, the failure detection circuit of the present embodiment can detect the performance degradation of a FeRAM not only when power is turned on, but also during operation when power is being supplied by having, for instance, the control section 6 checking for a failure detection signal all the time or on a regular bases.

Furthermore, it is possible to detect the performance degradation of a memory cell due to cumulative fatigue caused by reading the same data repeatedly by having the control section 6 check for a failure detection signal each time a prescribed data is being read.

Since the detector FeRAM cell 1 has the same structure as the original cell of the FeRAM, it can be disposed in an optional position within the FeRAM. It is also possible to use an optional original cell as a detector FeRAM cell 1. For instance, if the detector FeRAM cell 1 is disposed near an original cell in a specified area where important data is stored (or the original cell in the specified area is used as a detector FeRAM cell 1), the performance degradation of the specified area due to thermal stress can be detected by having the control section 6 check for a failure detection signal each time this important data is being read.

Furthermore, the filtering voltage generator circuit 2 can be made to generate multiple filtering voltages, and the filtering voltages can be varied according to a control signal from the control section 6 when the detector FeRAM cell 1 reproduces stored data. In this case, if the value of a filtering voltage with which the reproduced data and the expected value don't match is calculated by using the control section 6, the performance degradation condition of the FeRAM due to thermal stress will be able to be known. Furthermore, if the relationship between thermal stress and the output voltage of the detector FeRAM cell 1 is measured beforehand, how much thermal stress has been applied to the FeRAM will be able to be known.

Embodiment 2

Figure 2:
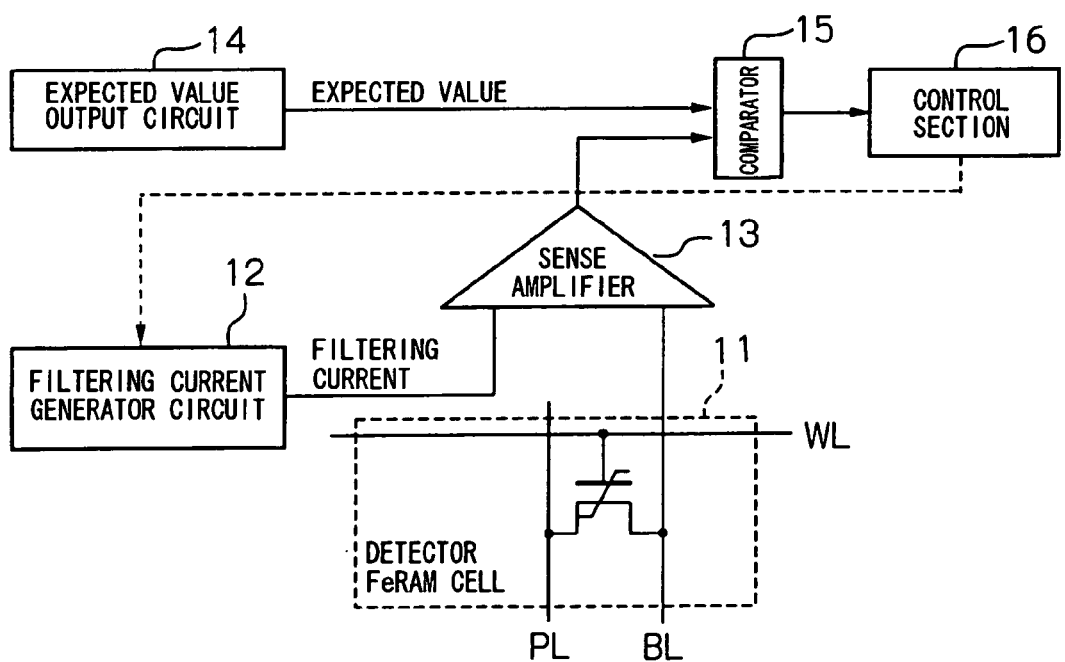
FIG. 2 is a block diagram showing the configuration of the second embodiment of the failure detection circuit according to the present invention.
Figure 3:
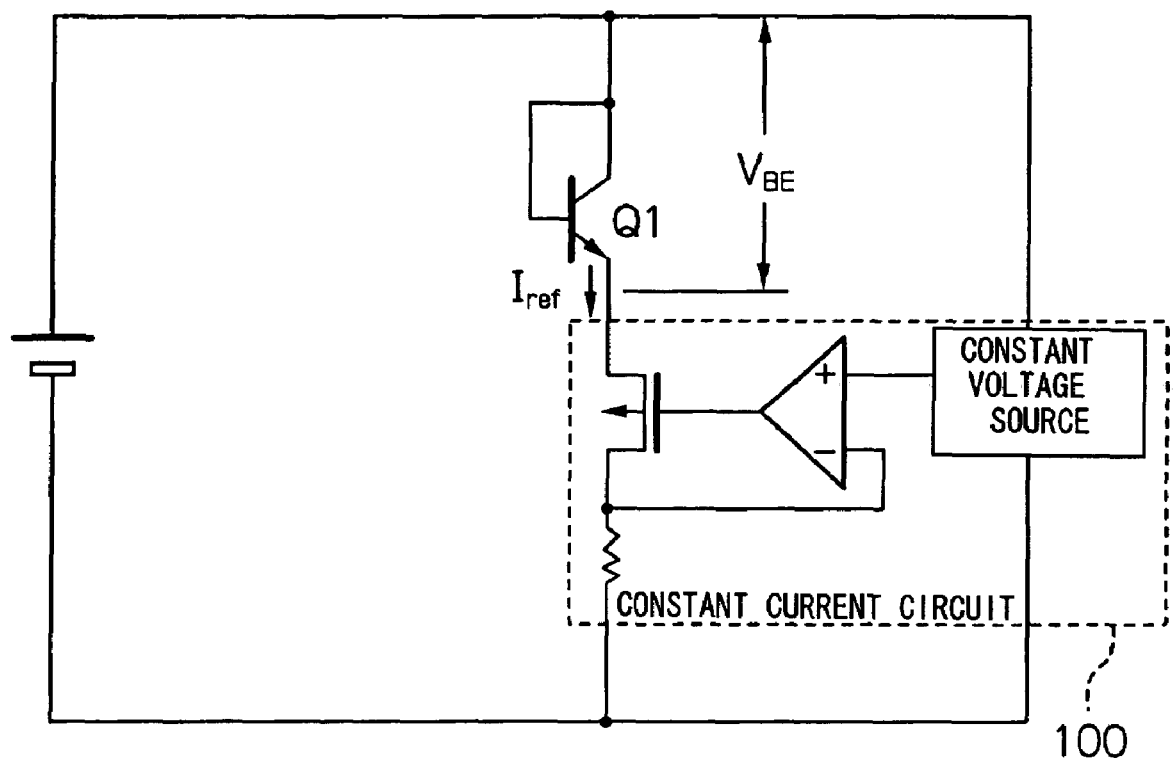
FIG. 3 is a circuit diagram showing the configuration of the conventional temperature detecting circuit used for temperature abnormality detection.

FIG. 2 is a block diagram showing the configuration of a second embodiment of a failure detection circuit according to the present invention.

As shown in FIG. 2, the failure detection circuit of the second embodiment comprises a detector FeRAM cell 11 used for detecting the performance degradation of memory cells caused by high temperature, a filtering current generator circuit 12, which generates filtering current used for determining the performance degradation of a FeRAM, a sense amplifier 13, which reproduces data stored in the detector FeRAM cell 11 using the filtering current, an expected value output circuit 14, which outputs an expected value equal to the data already stored in the detector FeRAM cell 11, and a comparator 15, which compares the expected value and the data reproduced by the sense amplifier 13, and outputs an failure detection signal indicating the performance degradation of the FeRAM when they don't match.

The failure detection circuit of the second embodiment is configured so that it detects the performance degradation of a FeRAM comprising multiple memory cells composed of an FET with a capacitor element using ferroelectric material provided in a gate electrode section. Such a memory cell is called 1T type, in which data "1" or "0" is held according to the polarization charge of the ferroelectric capacitor provided in the gate electrode section. The failure detection circuit shown in FIG. 2 is configured so that it determines the performance degradation of a FeRAM by having the sense amplifier 13 detect the change of a current flowing between the source and drain of the FET caused by the polarization charge fluctuation of the ferroelectric capacitor provided in the detector FeRAM cell 11.

The detector FeRAM cell 11 has the same structure as the 1T-type original cell actually used in the FeRAM, and is used for detecting the performance degradation instead of this original cell. It is desirable that this detector FeRAM cell 11 be formed simultaneously with the original cell of the FeRAM, the detection object. If this is the case, the performance degradation of the FeRAM caused by thermal stress will be detected more accurately since the detector FeRAM cell 11 and the original cell will have the same characteristics.

As shown in FIG. 2, a prescribed write voltage is applied to the ferroelectric capacitor provided in the gate electrode section of the detector FeRAM cell 11, as the original cell, through a word line (WL) when data is being written, and a prescribed read voltage is applied through the word line (WL) when data is being read. Further, a plate voltage is applied to the source of the FET through a plate line (PL), and the drain of the FET is connected to the sense amplifier 13 via a bit line (BL). The sense amplifier 13 detects the current flowing between the source and drain of the FET via the bit line (BL).

The filtering current generator circuit 12 comprises a known constant current circuit that supplies a prescribed constant current (filtering current) to the sense amplifier 13. Corresponding to an expected value of data "1" or "0", the filtering current is set to an optimum value for determining each data. As in Embodiment 1, the filtering current is set to a value so that the data stored in the detector FeRAM cell 11 cannot be read accurately before a failure occurs in the original cell. In other words, the filtering current is set to a higher value than a reference current value for judging the data stored in the original cell.

The sense amplifier 13 is a differential amplifier that amplifies a difference between the filtering current and the output current of the detector FeRAM cell 11 (the current flowing between the source and drain of the FET), and for instance, when the output current of the detector FeRAM cell 11 is higher than the filtering current, it outputs a voltage that corresponds to data "1", and when the output current of the detector FeRAM cell 11 is lower than the filtering current, it outputs a voltage that corresponds to data "0".

The description for the configurations and operations of the expected value output circuit 14, comparator 15, and a control section 16 are omitted because they are identical to the ones in Embodiment 1.

As in Embodiment 1, according to the failure detection circuit of the present embodiment, since the holding state of data stored in a FeRAM can be detected by checking for a failure detection signal, the mistaken use of a FeRAM whose performance is deteriorated by thermal stress can be prevented.

Furthermore, the failure detection circuit of the present invention is to be mounted on a semiconductor integrated circuit device or an electronic device equipped with a FeRAM, and all of the configuration elements or only parts of the configuration elements can be built into the FeRAM, the failure detection object.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A failure detection circuit for detecting the performance degradation of a ferroelectric random access memory, referred to FeRAM, comprising:
a detector FeRAM cell structured identically to an original cell actually employed within said FeRAM and used for detecting the performance degradation;
a filtering voltage generator circuit, which generates a filtering voltage used for determining said performance degradation;
an expected value output circuit, which outputs an expected value equal to data already stored in said detector FeRAM cell;
a sense amplifier, which reproduces data stored in said detector FeRAM cell using said filtering voltage; and
a comparator, which compares said expected value and data reproduced by said sense amplifier, and outputs an failure detection signal indicating the performance degradation of said FeRAM when they don't match.

2. The failure detection circuit as defined in claim 1 wherein the same structure as that of a either 1T1C-type or 2T2C-type memory cell is used for said detector FeRAM cell.

3. The failure detection circuit as defined in claim 1 wherein said filtering voltage is set to a voltage value higher than a reference voltage for determining data stored in said original cell.

4. The failure detection circuit as defined in claim 1 comprising a control section for observing said failure detection signal outputted from said comparator and notifying a memory failure to outside.

5. The failure detection circuit as defined in claim 4 wherein said control section checks for said failure detection signal each time power is turned on.

6. The failure detection circuit as defined in claim 4 wherein said control section checks for said failure detection signal during operation when said power is being supplied.

7. The failure detection circuit as defined in claim 4 wherein said control section checks for said failure detection signal when specified data is being read from said FeRAM.

8. The failure detection circuit as defined in claim 4 wherein said filtering voltage generator circuit outputs different multiple filtering voltages according to a prescribed control signal, and said control section outputs a control signal for varying said filtering voltages outputted from said filtering voltage generator circuit when data stored in said detector FeRAM cell is being reproduced, and calculates a filtering voltage when said failure detection signal is being outputted from said comparator.

9. A failure detection circuit for detecting the performance degradation of a ferroelectric random access memory, referred to FeRAM, comprising:
a detector FeRAM cell structured identically to an original cell actually employed within said FeRAM and used for detecting the performance degradation;
a filtering current generator circuit, which generates a filtering current used for determining said performance degradation;
an expected value output circuit, which outputs an expected value equal to data already stored in said detector FeRAM cell;
a sense amplifier, which reproduces data stored in said detector FeRAM cell using said filtering current; and
a comparator, which compares said expected value and data reproduced by said sense amplifier, and outputs an failure detection signal indicating the performance degradation of said FeRAM when they don't match.

10. The failure detection circuit as defined in claim 9 wherein the same structure as that of a 1T-type memory cell is used for said detector FeRAM cell.

11. The failure detection circuit as defined in claim 9 wherein said filtering current is set to a current value higher than a reference current for determining data stored in said original cell.

12. The failure detection circuit as defined in claim 9 comprising a control section for observing said failure detection signal outputted from said comparator and notifying a memory failure to outside.

13. The failure detection circuit as defined in claim 12 wherein said control section checks for said failure detection signal each time power is turned on.

14. The failure detection circuit as defined in claim 12 wherein said control section checks for said failure detection signal during operation when said power is being supplied.

15. The failure detection circuit as defined in claim 12 wherein said control section checks for said failure detection signal when specified data is being read from said FeRAM.

16. The failure detection circuit as defined in claim 12 wherein said filtering current generator circuit outputs different multiple filtering currents according to a prescribed control signal, and said control section outputs a control signal for varying said filtering currents outputted from said filtering current generator circuit when data stored in said detector FeRAM cell is being reproduced, and calculates a filtering current when said failure detection signal is being outputted from said comparator.

* * * * *